(12) United States Patent
Mori et al.

(10) Patent No.: US 9,936,620 B2
(45) Date of Patent: Apr. 3, 2018

(54) COMPONENT MOUNTING METHOD

(71) Applicant: Panasonic Intellectual Property Management Co., Ltd., Osaka (JP)

(72) Inventors: Taisuke Mori, Yamanashi (JP); Kenji Kamakura, Yamanashi (JP); Hideaki Kato, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 226 days.

(21) Appl. No.: 14/807,970

(22) Filed: Jul. 24, 2015

(65) Prior Publication Data

US 2016/0029521 A1 Jan. 28, 2016

(30) Foreign Application Priority Data

Jul. 28, 2014 (JP) ................. 2014-152550

(51) Int. Cl.
*H05K 13/02* (2006.01)
*B23P 17/04* (2006.01)
*H05K 13/04* (2006.01)

(52) U.S. Cl.
CPC ............... *H05K 13/0417* (2013.01)

(58) Field of Classification Search
CPC .......... B65H 21/00; B65H 2301/41524; B65H 2301/4421; B65H 2301/44514; B65H 2301/44516; B65H 2301/51122; B65H 23/16; B65H 2402/5441; B65H 2404/623
See application file for complete search history.

(56) References Cited

U.S. PATENT DOCUMENTS

| | | | | |
|---|---|---|---|---|
| 6,199,738 B1* | 3/2001 | Kondo | ................. | H05K 13/02 156/566 |
| 6,332,387 B1* | 12/2001 | Suhara | ............... | H05K 13/0417 221/25 |
| 7,738,118 B2* | 6/2010 | Nakane | .............. | H05K 13/0417 356/614 |
| 2011/0030201 A1* | 2/2011 | Inaba | ................. | H05K 13/0465 29/729 |

(Continued)

FOREIGN PATENT DOCUMENTS

| | | |
|---|---|---|
| JP | 2009-130303 A | 6/2009 |
| JP | 2010-050338 A | 3/2010 |
| JP | 2014-075478 A | 4/2014 |

*Primary Examiner* — Minh Trinh
(74) *Attorney, Agent, or Firm* — Pearne & Gordon LLP (57) ABSTRACT

A component mounting apparatus includes a component supply device that intermittently feeds a carrier tape, in which components are stored in a plurality of pockets formed with a uniform pitch, based on a predetermined feed pitch to supply the components stored in the pockets to a component suction position, and picks up the components supplied to the component suction position to mount the components onto a board, an imaging unit that images the pockets, and a control unit that measures a formation pitch of the pockets based on obtained image data, and changes a feed pitch of the carrier tape from the predetermined feed pitch to the formation pitch of the pockets when the measured formation pitch of the pockets and the predetermined feed pitch are different from each other, and the component supply device intermittently feeds the carrier tape based on the changed feed pitch.

1 Claim, 10 Drawing Sheets

(56) References Cited

U.S. PATENT DOCUMENTS

| | | | | |
|---|---|---|---|---|
| 2012/0305585 A1* | 12/2012 | Nagao | ............... | H05K 13/0417 221/25 |
| 2015/0258687 A1* | 9/2015 | Taishi | ................... | B25J 9/1687 156/351 |
| 2016/0029521 A1* | 1/2016 | Mori | ................. | H05K 13/0417 29/834 |
| 2017/0069057 A1* | 3/2017 | Kotani | .............. | H04N 1/19594 |

* cited by examiner

COMPONENT MOUNTING METHOD

CROSS-REFERENCES TO RELATED APPLICATION(S)

This application is based on and claims priority from Japanese Patent Application No. 2014-152550 filed on Jul. 28, 2014, the entire contents of which are incorporated herein by reference.

BACKGROUND

1. Field of the Invention

The present invention relates to a component mounting apparatus and a component mounting method for mounting a component onto a board.

2. Description of Related Art

A tape feeder is known as a component supply device that supplies a component to a mounting head provided in an electronic component mounting apparatus. A carrier tape in which components are stored in plural pockets formed with a uniform pitch is set in the tape feeder. The tape feeder intermittently feeds the carrier tape based on a predetermined feed pitch, to thereby supply the components in the pockets to a component suction position.

In a production site, a so-called replacement component which has approximately the same electric characteristic as that of a registered component of which component data is registered but is manufactured by a different component maker may be used (for example, see JP-A-2014-75478 as Patent Literature 1).

Patent Literature 1: JP-A-2014-75478

SUMMARY

However, between a carrier tape that holds registered components and a carrier tape that holds replacement components, formation pitches of pockets may be different from each other due to a difference in component makers. In this case, if the carrier tape that holds the replacement components is intermittently fed based on a feed pitch set in component data of the registered components, the following problems occur due to the difference between the set feed pitch and the formation pitch of the pockets. For example, when the feed pitch set in the component data is 2 mm and the formation pitch of the pockets where the replacement components are stored is 1 mm, one pocket among two adjacent pockets is fed in a tape feed direction without being stopped at a component suction position. Accordingly, about half the components held on the carrier tape are not suctioned by a suction nozzle provided in a mounting head, which causes wasteful components. Further, when the feed pitch set in the component data is 1 mm and the formation pitch of the pockets where the replacement components are stored is 2 mm, the suction nozzle alternately performs the suction at a position where the pocket is formed and a position where the pocket is not formed. Accordingly, a suction error frequently occurs, which causes loss in an operation cycle time. Further, since a feed pitch change operation should be performed by an operator, productivity is lowered. Furthermore, in the feed pitch change operation, a wrong feed pitch may be set due to an artificial mistake.

Accordingly, a non-limited object of one or more embodiments of the present invention is to provide a component mounting apparatus and a component mounting method capable of reducing the workload of an operator for a feed pitch change operation even when a predetermined feed pitch of a carrier tape and a formation pitch of pockets formed in a carrier tape that holds replacement components are different from each other.

An aspect of the present invention provides a component mounting apparatus including: a component supply device that intermittently feeds a carrier tape, in which components are stored in a plurality of pockets formed with a uniform pitch, based on a predetermined feed pitch to supply the components stored in the pockets to a component suction position, and picks up the components supplied to the component suction position to mount the components onto a board; an imaging unit that images the pockets; and a control unit that measures a formation pitch of the pockets based on obtained image data, and changes a feed pitch of the carrier tape from the predetermined feed pitch to the formation pitch of the pockets when the measured formation pitch of the pockets and the predetermined feed pitch are different from each other, wherein the component supply device intermittently feeds the carrier tape based on the changed feed pitch.

Another aspect of the present invention provides a component mounting method in a component mounting apparatus that intermittently feeds a carrier tape, in which components are stored in a plurality of pockets formed with a uniform pitch, based on a predetermined feed pitch to supply the components stored in the pockets to a component suction position, and picks up the components supplied to the component suction position to mount the components onto a board, the method including: imaging the pockets; measuring a formation pitch of the pockets based on obtained image data; determining whether the measured formation pitch of the pockets matches the predetermined feed pitch; changing a feed pitch of the carrier tape from the predetermined feed pitch to the formation pitch of the pockets when the formation pitch of the pockets and the predetermined feed pitch are different from each other; and intermittently feeding the carrier tape based on the changed feed pitch.

According to the aspects of the present invention, it may be possible to reduce the workload of an operator for a feed pitch change operation even when a predetermined feed pitch of a carrier tape and a formation pitch of pockets formed in a carrier tape that holds replacement components are different from each other.

DETAILED DESCRIPTION

Figure 1:
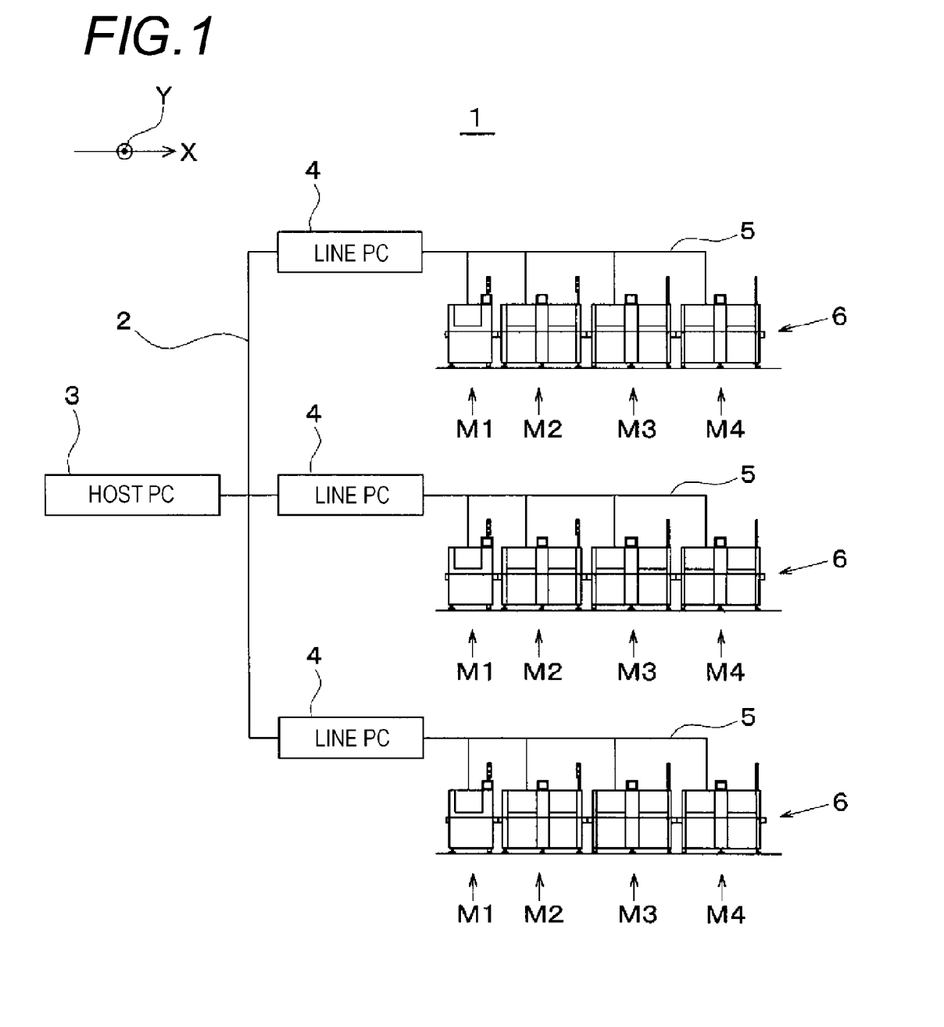
FIG. 1 is an overall configuration diagram of a component mounting system according to an embodiment of the present invention.

First, a component mounting system 1 according to an embodiment of the present invention will be described with reference to FIG. 1. The component mounting system 1 has a function of manufacturing a component-mounted board in which a component is mounted on a board, and includes a host PC (computer) 3 and plural line PCs 4 that are connected to each other through a communication network 2, and plural mounting lines 6 that are connected to communicate with the respective line PCs 4 through a communication network 5. The host PC 3 has a function of creating a variety of data such as mounting data or component data used in manufacturing of a component-mounted board performed for each mounting line 6.

The line PC 4 has a function of collecting and managing operation information such as mounting histories of components successively transmitted from the mounting line 6, and a function of storing a variety of data downloaded from the host PC 3. The host PC 3 and the line PCs 4 will be described later in detail.

The mounting line 6 includes a printer M1, and plural component mounting apparatuses M2, M3, and M4 that are arranged in connection in a transport direction of a board. The printer M1 prints solder paste onto an electrode of the board. The component mounting apparatuses M2 to M4 mount a component onto the board where the solder paste is printed. Hereinafter, the transport direction of the board is defined as an X direction, and a direction orthogonal to the X direction in the horizontal plane is defined as a Y direction.

Next, the component mounting apparatuses M2 to M4 will be described with reference to FIGS. 2 and 3. On an upper surface of a base 7, a board transport mechanism 8 that includes a pair of transport conveyors that extend in the X direction is provided. The board transport mechanism 8 transports a board 9 to be positioned at a predetermined mounting operation position. At both side positions of the board transport mechanisms 8 in the Y direction, component supply sections 10 are respectively provided. In the component supply section 10, plural tape feeders 11 are arranged in parallel in the X direction. Hereinafter, a direction that is directed toward the base 7 (toward a side where the board transport mechanism 8 is arranged) is defined as a forward direction, and a direction opposite thereto is defined as a backward direction.

The tape feeder 11 functions as a component supply device that intermittently feeds a carrier tape 13 that holds plural components 12 in the forward direction to supply the components 12 into a component suction position with respect to a suction nozzle 23 (which will be described later). The carrier tape 13 is stored in a state of being wound on a supply reel 14, and the supply reel 14 is rotatably held by a reel holding member provided in a carriage 15.

Figure 4A:
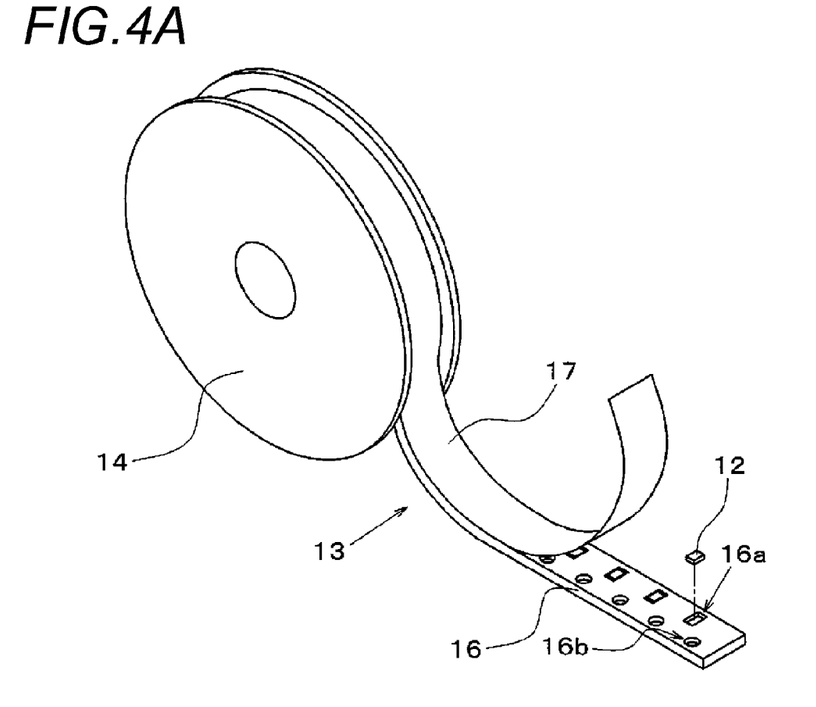
FIGS. 4A and 4B are diagrams illustrating a structure of a carrier tape according to an embodiment of the present invention.
Figure 4B:
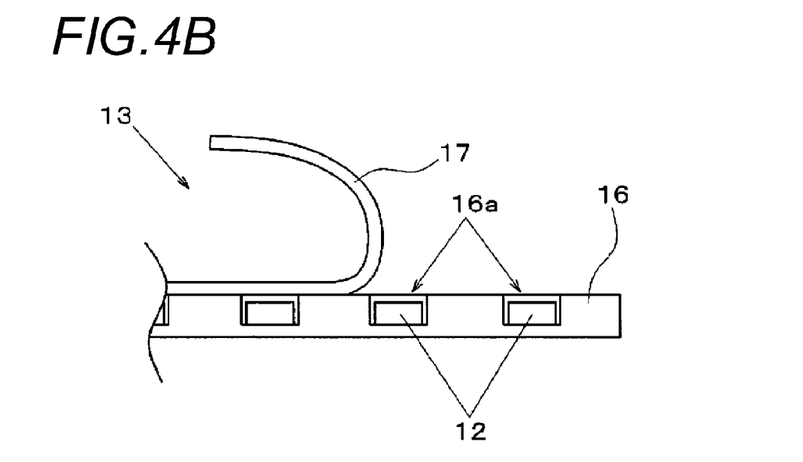

In FIGS. 4A and 4B, the carrier tape 13 includes a base tape 16 in which concave pockets 16a are formed with a uniform pitch, and a top tape 17 that seals an upper surface of the base tape 16. Further, in one side portion of the base tape 16, holes 16b are formed with a uniform pitch.

The components 12 are stored in the pockets 16a. The components 12 have plural sizes such as a 0402 size, 0603 size, or 1005 size, and the formation pitch of the pockets 16a varies according to the size of the components 12. However, since there is no JIS standard relating to the formation pitch of the pockets 16a, the formation pitch of the pockets 16a may vary between component makers even when making the same component size. Thus, for example, in the case of the 0603 size, a carrier tape of which the formation pitch of the pockets 16a is 1 mm and a carrier tape of which the formation pitch of the pockets 16a is 2 mm may be present together.

Figure 5A:
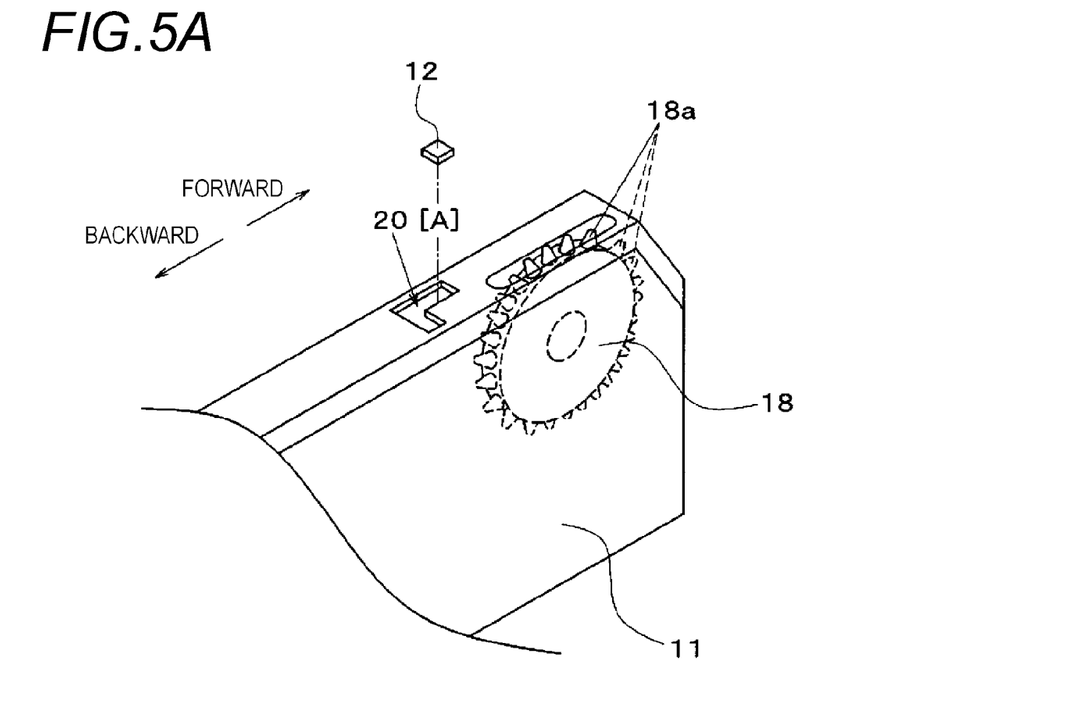
FIGS. 5A and 5B are diagrams illustrating a structure of a tape feeder according to an embodiment of the present invention.
Figure 5B:
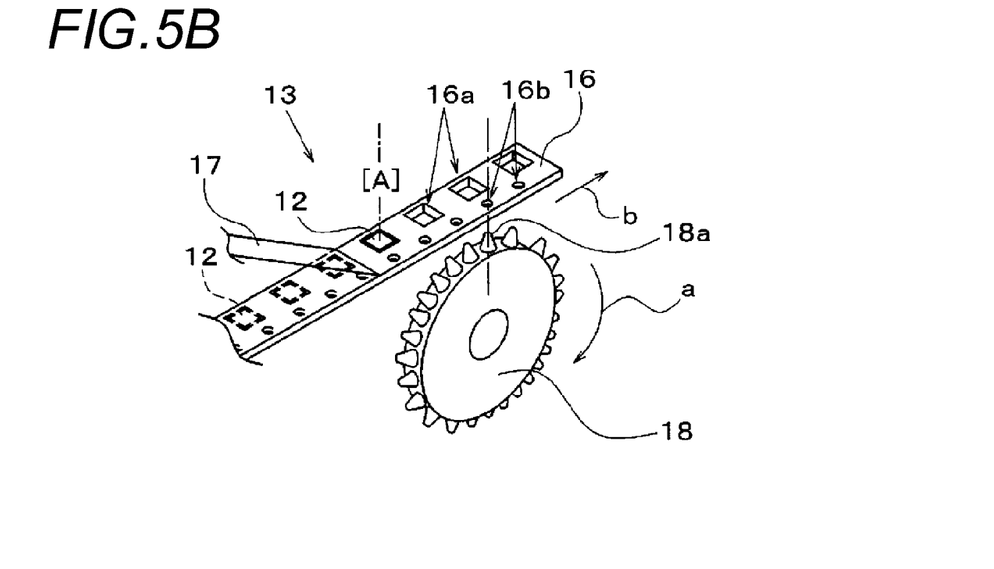
Figure 6:
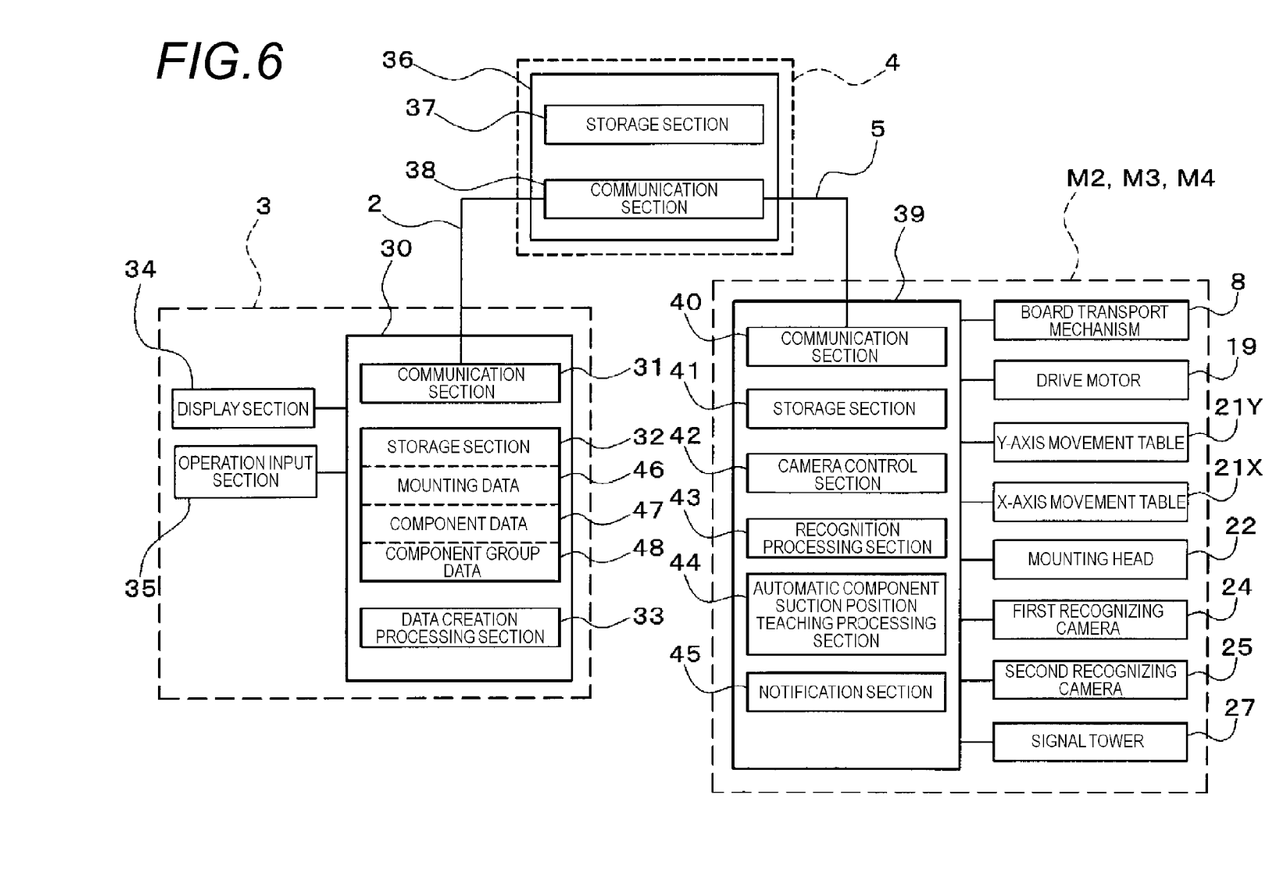
FIG. 6 is a block diagram illustrating a configuration of a control system of a component mounting system according to an embodiment of the present invention.

In FIG. 5A, a sprocket 18 is built in the front of the tape feeder 11. Plural protrusions 18a are provided in an outer circumferential portion of the sprocket 18. The sprocket 18 is intermittently rotated by a drive motor 19 which is a drive mechanism (FIG. 6). As shown in FIG. 5B, as the sprocket 18 rotates in a state where the protrusions 18a are fitted in the holes 16b (arrow a), the carrier tape 13 is intermittently fed forward (arrow b).

An upper portion of the tape feeder 11 which is near a position (backward side) with respect to the sprocket 18 corresponds to a component suction position [A] where the component 12 in the pocket 16a is suctioned by a suction nozzle 23 for pickup. An approximately L-shaped opening 20 corresponding to the component suction position [A] is provided in the tape feeder 11. The tape feeder 11 includes a top tape gathering mechanism (not shown), and the top tape gathering mechanism pulls the top tape 17 separated from the base tape 16 through a backward side end portion of the opening 20 toward the backward side for gathering (FIG. 5B). Accordingly, the component 12 stored in the pocket 16a is supplied to the component suction position [A] in an exposed state.

Figure 3:
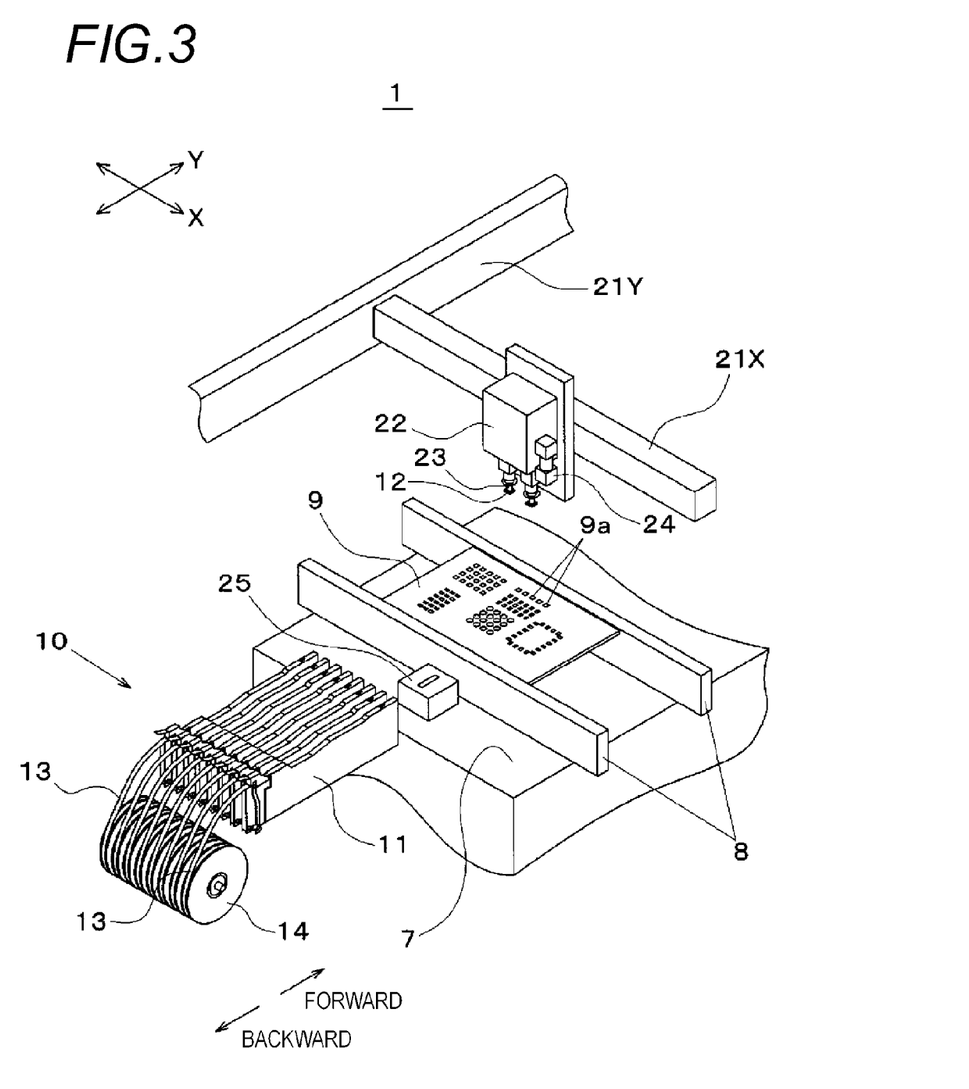
FIG. 3 is a partial perspective view of a component mounting apparatus that forms a component mounting system according to an embodiment of the present invention.

In FIG. 3, a Y-axis movement table 21Y is provided in one end portion of the base 7 in the X direction, and an X-axis movement table 21X is provided to be movable in the Y direction in the Y-axis movement table 21Y. Further, a mounting head 22 is mounted to be movable in the X-axis direction in the X-axis movement table 21X. The Y-axis movement table 21Y and the X-axis movement table 21X move the mounting head 22 in the X direction and the Y direction. The mounting head 22 includes plural suction nozzles 23 capable of suctioning the components 12, and the suction nozzle 23 suctions and picks up the component 12 supplied to the component suction position [A], and mounts the component onto an electrode 9a of the board 9.

The mounting head 22 includes a first recognizing camera 24 (recognizing camera) having an imaging visual field that is directed downward. The first recognizing camera 24 images the board 9 that is positioned at a mounting operation position or the pockets 16a that are disposed under the opening 20 of the tape feeder 11. The first recognizing camera 24 is an imaging unit that images the pockets 16a.

On the base 7, a second recognizing camera 25 having an imaging visual field that is directed upward is provided between the component supply section 10 and the board transport mechanism 8. The second recognizing camera 25 images the component 12 held by the mounting head 22 that moves above the second recognizing camera 25 from below.

Figure 2:
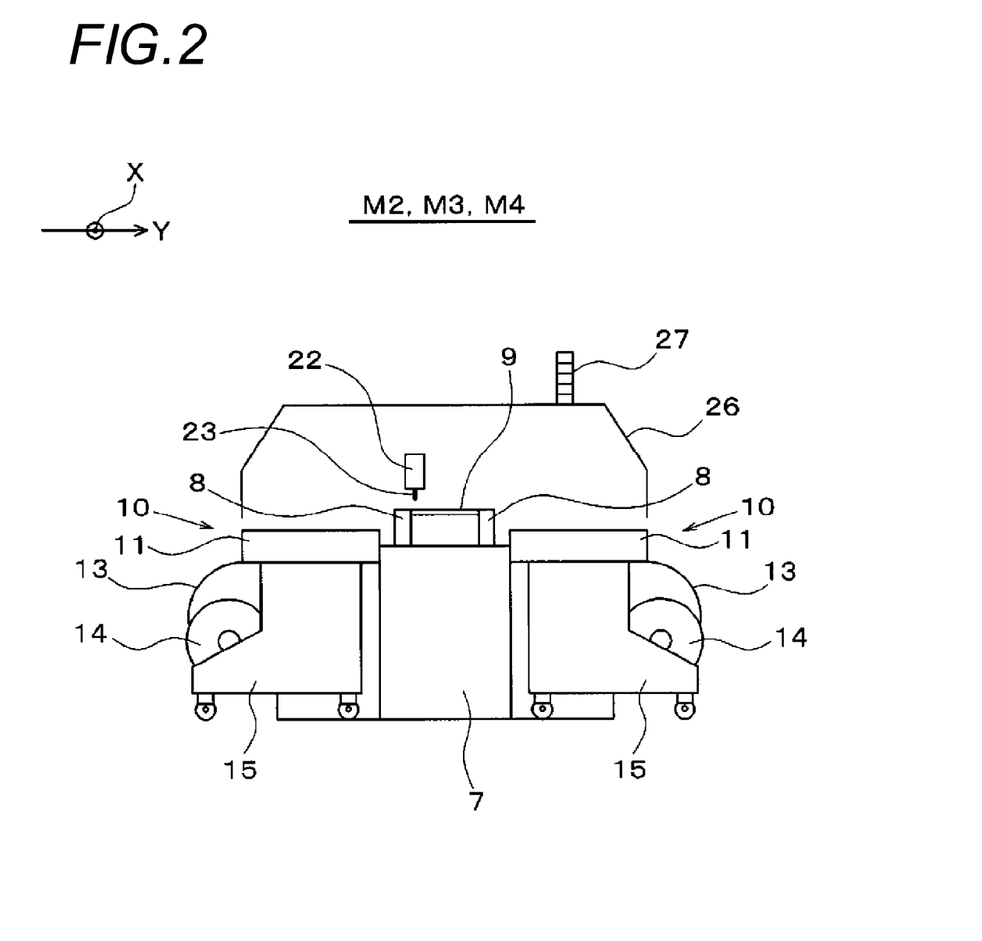
FIG. 2 is a side view of a component mounting apparatus that forms a component mounting system according to an embodiment of the present invention.

In FIG. 2, the respective mechanisms such as the board transport mechanism 8, the tape feeder 11, and the mounting head 22 are covered by a cover member 26. In an upper part of the cover member 26, a signal tower 27 is vertically provided. The signal tower 27 lights up or flickers when a certain problem occurs during operation of the component mounting apparatuses M2 to M4.

Next, a configuration of a control system of the component mounting system 1 will be described with reference to FIG. 6. A control unit 30 provided in the host PC 3 includes a communication section 31, a storage section 32, and a data creation processing section 33, and is connected to a display section 34 and an operation input section 35. A control unit 36 provided in the line PC 4 includes a storage section 37 and a communication section 38. A control unit 39 provided in the component mounting apparatuses M2 to M4 includes a communication section 40, a storage section 41, a camera control section 42, a recognition processing section 43, an automatic component suction position teaching processing section 44, and a notification section 45. Further, the control unit 39 is connected to the board transport mechanism 8, the drive motor 19, the Y-axis movement table 21Y, the X-axis movement table 21X, and the mounting head 22, the first recognizing camera 24, the second recognizing camera 25, and the signal tower 27.

The communication section 31 of the host PC 3 is connected to the communication section 38 of the line PC4 through the communication network 2, and performs an exchange of control signals or a variety of data. The storage section 32 stores mounting data 46, component data 47, component group data 48 or the like. The mounting data 46 refers to data for mounting the component 12 onto the board 9, and includes X-Y coordinates of a mounting position set on the board 9, a mounting angle of the component 12, arrangement information on the tape feeder 11 or the like.

Figure 7:
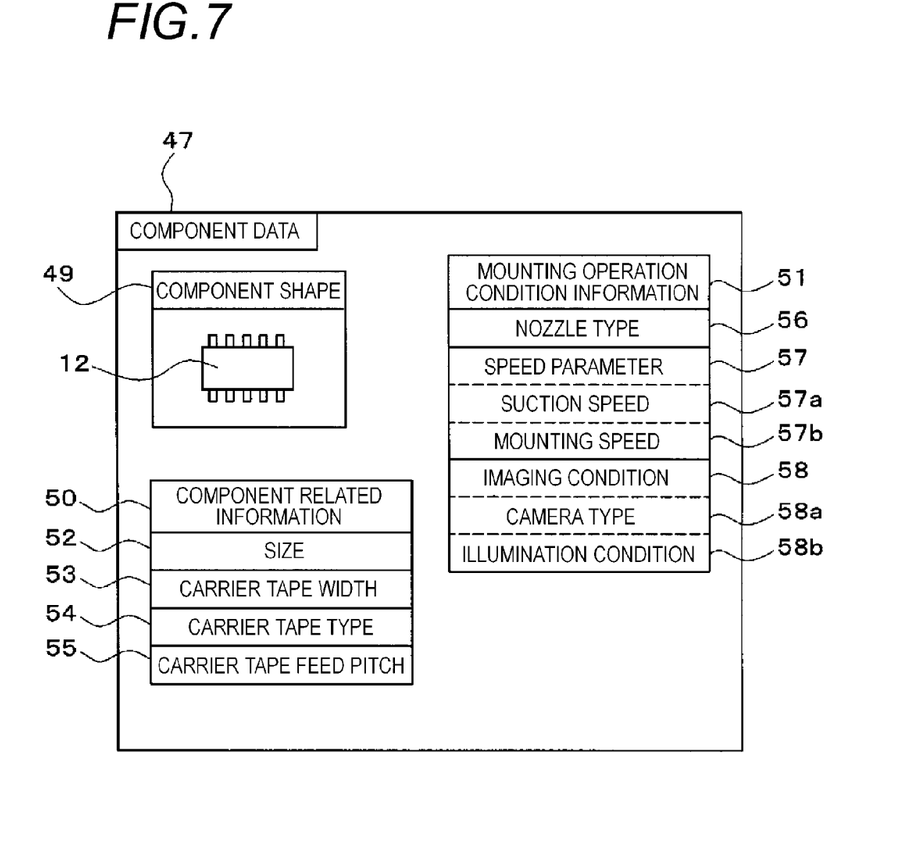
FIG. 7 is a diagram illustrating component data according to an embodiment of the present invention.

The component data 47 refers to data including a variety of data relating to the component 12. As shown in FIG. 7, the component data 47 includes "component shape" 49, "component related information" 50, and "mounting operation condition information" 51. The "component shape" 49 indicates the appearance of the component 12 which is a mounting target. The "component related information" 50 includes information relating to the component 12, such as a size 52 of the component 12, a width 53 of the carrier tape 13 that stores the component 12, a type 54 of the carrier tape 13, or a feed pitch 55 of the carrier tape 13, for example.

The "mounting operation condition information" 51 includes a nozzle type 56 indicating the type of the suction nozzle 23 used corresponding to the type of the component 12, a speed parameter 57 such as a suction speed 57a when the suction nozzle 23 suctions the component 12 and a mounting speed 57b when the component 12 is mounted on the board 9, and the like. Further, the "mounting operation condition information" 51 also includes an imaging condition 58 such as a camera type 58a and an illumination condition 58b used in imaging the component 12 picked up by the mounting head 22 by the second recognizing camera 25.

The component group data 48 refers to data obtained by grouping a registered component and a replacement component capable of being mounted at a common mounting position, in which respective component names of the registered component and the replacement component are combined. The registered component refers to a component for which the component data 47 is created. The replacement component refers to a component that has approximately the same electric characteristic as that of the registered component and is usable in place of the registered component, for which the component data 47 is not created.

In a production site, registered components manufactured by a certain component maker and replacement components manufactured by another component maker may be prepared together for ease of component procurement. Thus, the component group data 48 is created by the host PC 3. Normally, in the production site, the registered components are preferentially used, and the replacement components are used when the registered components run out of stocks, for example. In this description, the term "component" indicates "registered component".

The data creation processing section 33 executes a process for creating a variety of data. For example, in the case of the component data 47, the data creation processing section 33 displays a guide screen for creating the component data 47 in the display section 34, and receives an input from an operator through the operation input section 35. The operator inputs numerical values of the width, the feed pitch, or the like of the carrier tape 13, according to the guide screen.

In the host PC 3, only the component data 47 of the registered component is created, and the component data 47 of the replacement component is not created. The reason is as follows. That is, since the registered component and the replacement component are in a compatible relation, it may be considered that the size or shape is approximately the same in addition to the electric characteristic. Thus, it is considered that there is no particular problem even though the component data 47 of the registered component is used when the replacement component is a supply target. Further, it is possible to reduce the workload of the operator for creating the component data 47 of the replacement component.

However, the formation pitch of the pockets 16a of the carrier tape 13 that holds the registered components may not essentially match that of the carrier tape 13 that holds the replacement components, due to a difference between component makers or the like. Accordingly, when the carrier tape 13 that holds the replacement components is intermittently fed based on a predetermined feed pitch in the component data 47, the components 12 stored in the pockets 16a may be fed forward without being stopped at the component suction position [A], which may cause the components to be wasted. Further, since the suction nozzle 23 performs the suction operation with respect to a position where the pocket 16a is not formed while wasting the components, a suction error may frequently occur. An object of the component mounting apparatuses M2 to M4 in the present embodiment is to eliminate such a problem.

The display section 34 is a display device such as a monitor, and displays a guide screen for creating a variety of data, or the like. The operation input section 35 is an input device such as a keyboard or a mouse, and is used when the operator performs a predetermined input to the host PC 3.

The storage section 37 of the line PC4 stores the mounting data 46 or the component data 47 downloaded from the host PC 3, or operation information of the component mounting apparatuses M2 to M4 connected to the line PC4. The communication section 38 is connected to the communication section 40 of the component mounting apparatuses M2 to M4 through the communication network 5, and performs an exchange of control signals or a variety of data.

The storage section 41 of the component mounting apparatuses M2 to M4 stores the mounting data 46 or the component data 47 downloaded from the line PC4. The control unit 39 controls the respective mechanisms such as the board transport mechanism 8, the drive motor 19 or the mounting head 22 based on the mounting data 46, the component data 47 or the like stored in the storage section 41. Thus, the board transport mechanism 8 transports the board 9 to be positioned at the mounting operation position, and the suction nozzle 23 suctions the component 12 from the component suction position [A] set in the tape feeder 11 and mounts the component 12 onto the board 9. Further, the tape feeder 11 intermittently feeds the carrier tape 13 to supply the component 12 to the component suction position [A].

The camera control section 42 controls the first recognizing camera 24 to image the board 9 positioned at the mounting operation position or to image the pockets 16a through the opening 20 of the tape feeder 11. Further, the camera control section 42 controls the second recognizing camera 25 to image the component 12 held by the mounting head 22. The recognition processing section 43 recognizes image data obtained by the first recognizing camera 24 and the second recognizing camera 25, to thereby detect the board 9, the pocket 16a, and the component 12. Detection results of the board 9 and the component 12 are used when the mounting head 22 is aligned with respect to the board 9 in mounting the component 12. Further, a detection result of the pocket 16a is used for teaching the component suction position [A] to the suction nozzle 23, or measuring the formation pitch of the pockets 16a, for example.

The automatic component suction position teaching processing section 44 executes a process for teaching the component suction position [A] to the suction nozzle 23. Further, the automatic component suction position teaching processing section 44 also executes a process of determining the feed pitch of the carrier tape 13 based on the formation pitch of the pockets 16a. More specifically, the automatic component suction position teaching processing section 44 measures the formation pitch of the pockets 16a based on the image data of the pockets 16a. Further, when the formation pitch of the pockets 16a and the predetermined feed pitch in the component data 47 are different from each other, the automatic component suction position teaching processing section 44 changes the feed pitch of the component data 47 stored in the storage section 41 to the formation pitch of the pockets 16a. According to the change of the component data 47, the component data 47 stored in a storage section of another component mounting apparatus that forms the mounting line 6 where the component mounting apparatus is included is also changed.

In this way, the control unit 39 (the automatic component suction position teaching processing section 44) measures the formation pitch of the pockets 16a based on the obtained image data, and when the measured formation pitch of the pockets 16a is different from the predetermined feed pitch, the feed pitch of the carrier tape 13 is changed from the predetermined feed pitch to the formation pitch of the pockets.

The notification section 45 lights up or flickers light on the signal tower 27 to notify the operator of the occurrence of a problem.

The component mounting system 1 of the present embodiment is formed as described above. Next, the flow of the automatic component suction position teaching will be described with reference to the flowchart of FIG. 8. The automatic component suction position teaching is performed in stage exchange performed before the manufacturing of the component-mounted board is started, when the operator sets the tape feeder 11, when a suction error occurs, or when the operator supplements the carrier tape 13 as the components 12 are used up in the component-mounted board manufacturing process, for example.

Figure 8:
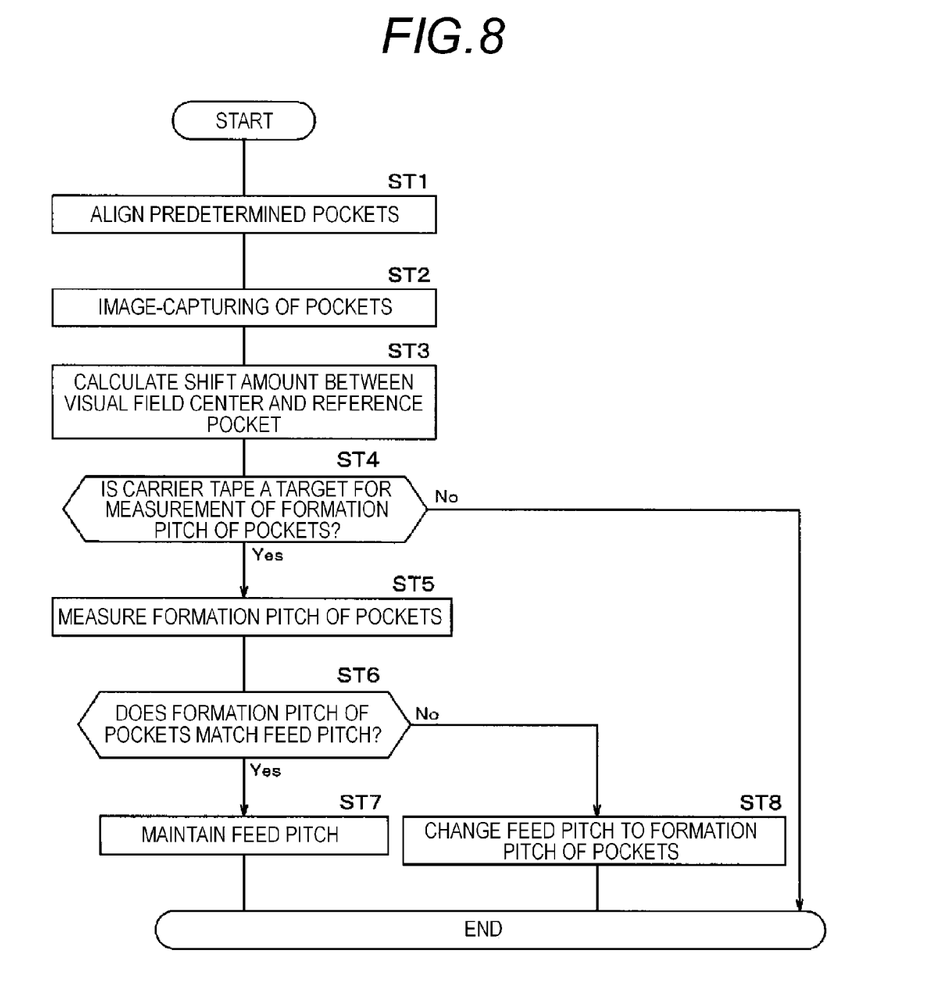
FIG. 8 is a flowchart illustrating automatic suction position teaching according to an embodiment of the present invention.
Figure 9A:
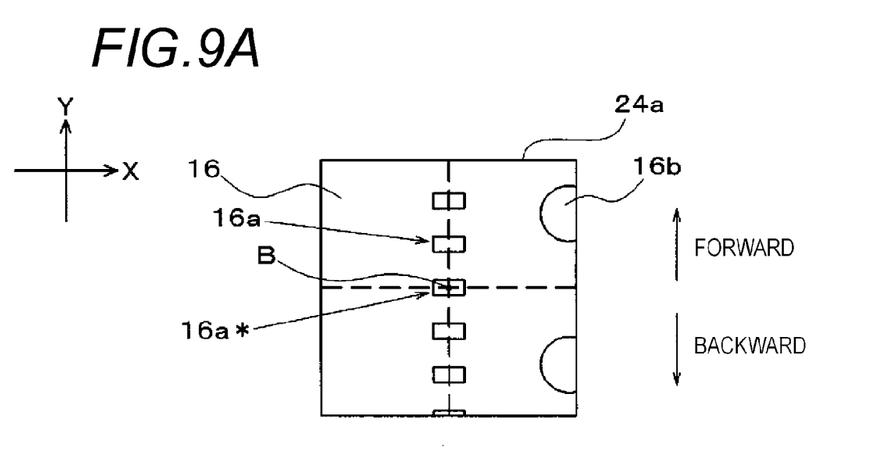
FIGS. 9A to 9C are diagrams illustrating an imaging visual field of a recognizing camera according to an embodiment of the present invention.
Figure 9B:
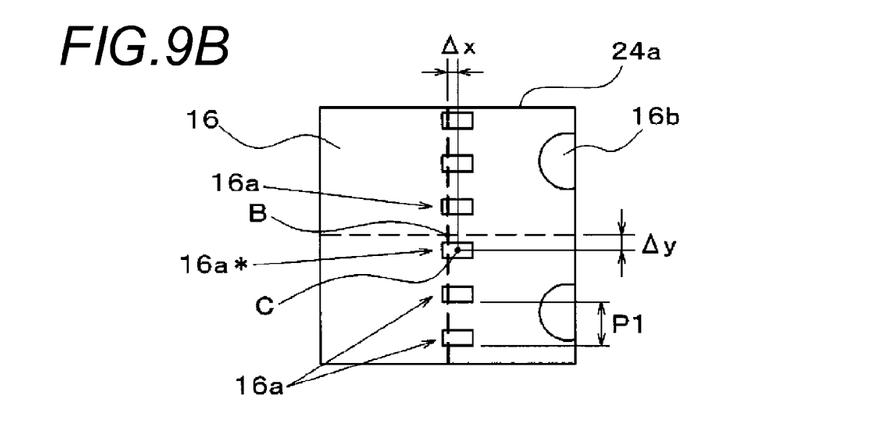
Figure 9C:
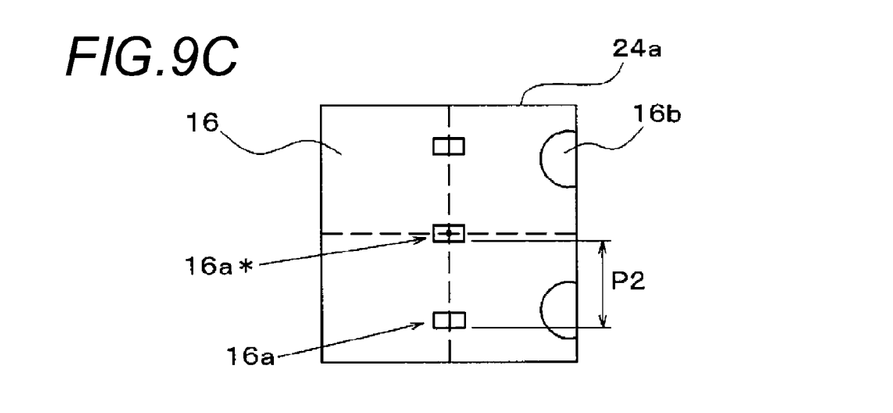

First, the tape feeder 11 intermittently feeds the carrier tape 13 to align the predetermined pocket 16a at the component mounting position [A] (ST1: pocket aligning process). Then, the first recognizing camera 24 moves above the opening 20 of the tape feeder 11, and images the plural pockets 16a positioned under the opening 20 (ST2: pocket imaging process). Here, the first recognizing camera 24 moves so that the center of the camera visual field matches the center of the component suction position [A]. FIGS. 9A, 9B, and 9C show images (camera visual fields) 24a captured by the first recognizing camera 24. As shown in FIG. 9A, when the carrier tape 13 that stores the registered components is normally pitch-fed without causing an error, a visual field center B of the first recognizing camera 24 matches the center of the pocket 16a in the horizontal plane.

Next, the control unit 39 specifies the pocket 16a which is the closet to the visual field center B as a reference pocket 16a*, based on the recognition processing result of the image data. Further, as shown in FIG. 9B, the control unit 39 calculates a shift amount ($\Delta x$, $\Delta y$) between the visual field center B and a center C of the reference pocket 16a* in the horizontal plane (ST3: shift amount calculation process).

Further, the component suction position [A] is adjusted based on the calculated shift amount ($\Delta x$, $\Delta y$). That is, the tape feeder 11 moves the carrier tape 13 by $\Delta y$ forward or backward (forward in the case shown in FIG. 9B), to thereby correct the shift of the component suction position [A] in the Y direction. Further, the control unit 39 instructs the suction nozzle 23 to suction the component 12 at a position shifted by $\Delta x$ with reference to the visual field center B. Thus, the suction nozzle 23 can suction the center of the component 12 in the horizontal plane.

After ST3 is finished, a process of determining the feed pitch of the carrier tape 13 is continuously performed. Hereinafter, for example, a case where the formation pitch of the pockets 16a that store the components 12 (registered components) is "1 mm" and the formation pitch of the pockets 16a that store the replacement components is "2 mm" will be described. First, the control unit 39 determines whether the carrier tape 13 which is an automatic component suction position teaching target is a target used for the measurement of the formation pitch of the pockets 16a (ST4: pitch measurement capability determination process). This determination is performed based on the size of the component 12. That is, in this process, it is determined whether to measure the formation pitch of the pockets 16a based on the component size. The control unit 39 may perform the determination based on the type or width of the carrier tape 13, in addition to the size of the component 12.

The reason for determining whether to measure the formation pitch of the pockets 16a is as follows. Normally, the components 12 having a possibility that the formation pitches of the pockets 16a are different from each other between the registered components and the replacement components are limited to the components 12 having a specific size such as the size 0603. Accordingly, in most cases, the formation pitches of the pockets 16a are not different between the registered components and the replacement components with respect to the components 12 having a size other than the specific size such as 0603. Thus, in the present embodiment, the components 12 having the size other than the specific size are excluded from measurement targets of the formation pitch of the pockets 16a. In this way, by limiting the measurement targets of the formation pitch of the pockets, it is possible to remove a wasteful feed pitch determination operation, to thereby suppress a reduction in productivity.

When the determination result is "No" in ST4, that is, when it is determined that the carrier tape 13 is not the measurement target of the formation pitch of the pockets 16a, the automatic component suction position teaching is terminated. On the other hand, when the determination result is "Yes", the control unit 39 measures the formation pitch of the pockets 16a based on the image data obtained by the first recognizing camera 24 (ST5: pitch measurement process). That is, this process is executed when it is determined that the formation pitch of the pockets 16a is measured in the pitch measurement capability determination process (ST4).

Thereafter, the control unit 39 determines whether the measured formation pitch of the pockets 16a matches the predetermined feed pitch (1 mm) of the carrier tape 13 in the component data 47 (ST6: first pitch determination process). FIG. 9B shows the captured image 24a of the base tape 16 (carrier tape 13) of which the formation pitch P1 of the pockets 16a is 1 mm.

When the determination result is "Yes" in ST6, the control unit 39 terminates the automatic component suction position teaching. Accordingly, the feed pitch of the carrier tape 13 is maintained as is (the predetermined feed pitch (1 mm) in the component data 47) (ST7: feed pitch maintenance process).

Further, when the determination result is "No" in ST6, the control unit 39 changes the feed pitch of the carrier tape 13 to the measured formation pitch of the pockets 16a (ST8: feed pitch change process). FIG. 9C shows the captured image 24a of the base tape 16 of which the formation pitch P2 of the pockets 16a is 2 mm. In this case, the control unit 39 changes the feed pitch of the carrier tape 13 to 2 mm.

That is, in this process, when the formation pitch of the pockets 16a and the predetermined feed pitch are different from each other, the feed pitch of the carrier tape 13 is changed from the predetermined feed pitch to the formation pitch of the pockets 16a. The automatic component suction position teaching is terminated through the above-described processes. When the manufacturing of the component-mounted board is started, the tape feeder 11 intermittently feeds the carrier tape 13 with the changed feed pitch (2 mm).

Figure 10:
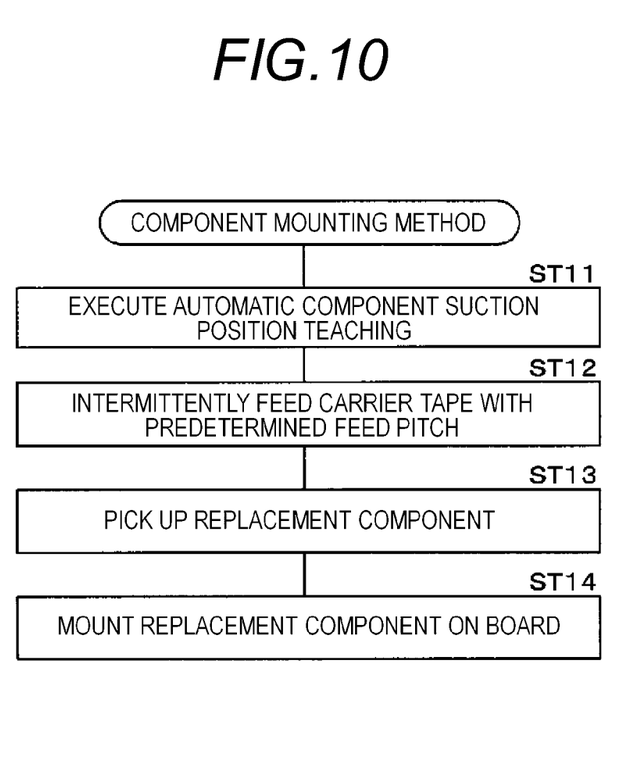
FIG. 10 is a flowchart of a component mounting method according to an embodiment of the present invention.

Next, a component mounting method will be described with reference to a flowchart of FIG. 10. First, the control unit 39 performs the above-described automatic component suction position teaching process (ST11: automatic component suction position teaching process). Then, the tape feeder 11 intermittently feeds the carrier tape 13 with the predetermined feed pitch determined in the automatic component suction position teaching (ST12: tape feed process). That is, when the feed pitch is maintained as is (ST7), the tape feeder 11 intermittently feeds the carrier tape 13 based on the predetermined feed pitch (1 mm) in the component data 47. Further, when the feed pitch is changed (ST8), the tape feeder 11 intermittently feeds the carrier tape 13 based on the changed feed pitch (2 mm). Thus, the replacement components stored in all the pockets 16a are supplied to the component suction position [A]. Then, the mounting head 22 suctions and picks up the replacement component supplied to the component suction position [A] by the suction nozzle 23 (ST13: component picking-up process). Thereafter, the mounting head 22 mounts the replacement component onto the board 9 that is aligned at the mounting operation position (ST13: component mounting process).

In this way, the component mounting apparatuses M2 to M3 according to the present embodiment include the component supply device that intermittently feeds the carrier tape 13 in which the components 12 are stored based on the predetermined feed pitch to the plural pockets 16a formed with the uniform pitch, to supply the components 12 stored in the pockets 16a to the component suction position [A], and has a function of picking up the component 12 supplied to the component suction position [A] and mounting the component 12 onto the board 9. Further, when the formation pitch of the pockets 16a is measured based on the image data of the pockets 16a obtained by the imaging unit, and when the formation pitch of the pockets 16a is different from the predetermined feed pitch, the feed pitch of the carrier tape 13 is changed from the predetermined feed pitch to the formation pitch of the pockets 16a, and then, the component supply device intermittently feeds the carrier tape 13 based on the changed feed pitch.

Thus, even when the predetermined feed pitch of the carrier tape 13 and the formation pitch of the pockets 16a formed in the carrier tape 13 that holds the replacement components are different from each other, it is possible to reduce the workload of the operator for the feed pitch change operation. Further, it is possible to prevent a problem that a wrong feed pitch is set due to an artificial mistake. In addition, since the determination of the feed pitch is performed using the image data of the pockets 16a obtained for the automatic component suction position teaching, it is possible to eliminate the effort of imaging the pockets 16a for only the determination of the feed pitch.

According to the embodiment of the present invention, it may be possible to reduce the workload of an operator for a feed pitch change operation even when a predetermined feed pitch of a carrier tape and a formation pitch of pockets formed in a carrier tape that holds replacement components are different from each other, which is useful in an electronic component mounting field.

What is claimed is:
1. A component mounting method comprising:
providing a mounting apparatus including a component supply device that intermittently feeds a carrier tape having components stored in a plurality of pockets with a feed pitch; an imaging unit that images the pockets; a control unit that stores data of a predetermined feed pitch, measures a formation pitch of the pockets and determine whether the formation pitch marches with the predetermined feed pitch; a board transport mechanism that transports a board to be positioned at a predetermined mounting operation position; and a mounting head that picks up the components from the plurality of pockets and mounts the components onto the board;
imaging the plurality of pockets by the imaging unit to obtain image data;
measuring the formation pitch of the plurality of pockets by the control unit based on the image data;
determining whether the measured formation pitch of the plurality of pockets matches the predetermined feed pitch by the control unit;
feeding the carrier tape with the predetermined feed pitch by the component supply device if the control unit determines that the measured formation pitch of the plurality of pockets matches the predetermined feed pitch, or changing the feed pitch of the carrier tape from the predetermined feed pitch to the measured formation pitch and feeding the carrier tape with the measured formation pitch by the component supply device if the control unit determines that the measured formation pitch of the plurality of pockets does not match the predetermined feed pitch;
transporting the board to the predetermined mounting operation position by the board transport mechanism;
picking up the components from the plurality of pockets by the mounting head; and mounting the components picked up by the mounting head onto the board at the predetermined mounting operation position.

\* \* \* \* \*